United States Patent [19]

Russell et al.

[11] 3,737,800

[45] June 5, 1973

[54] HIGH VOLTAGE OPERATIONAL AMPLIFIER

[75] Inventors: Ronald W. Russell, Mesa; James E. Solomon, Scottsdale, both of Ariz.

[73] Assignee: Motorla, Inc., Franklin, Ill.

[22] Filed: June 15, 1970

[21] Appl. No.: 46,253

[52] U.S. Cl. ....................330/207 P, 330/24, 330/17, 330/35, 330/18, 330/30 D

[51] Int. Cl. ..............................................H03f 21/00

[58] Field of Search ....................330/207 P, 40, 200, 330/199 T, 30 D

[56] References Cited

UNITED STATES PATENTS

| | | | |
|---|---|---|---|
| 3,262,016 | 7/1966 | Martin | 330/207 P X |
| 3,376,388 | 4/1968 | Reiffin | 330/207 P X |
| 3,500,218 | 3/1970 | Burwel | 330/207 P |
| 3,548,326 | 12/1970 | Bilotti | 330/30 D X |
| 3,548,333 | 12/1970 | Bakke et al. | 330/30 D |
| 3,466,390 | 9/1969 | Ihamiya | 330/207 PX |

*Primary Examiner*—Nathan Kaufman
*Attorney*—Mueller and Aichele

[57] ABSTRACT

A monolithic operational amplifier is disclosed suitable for high voltage operation including an input transistor protection capability under large signal swing and a negative short circuit limit function. Another feature includes an internal current regulator and a protection circuit for circuit turn on.

2 Claims, 2 Drawing Figures

Patented June 5, 1973

3,737,800

2 Sheets-Sheet 1

Figure 1A:
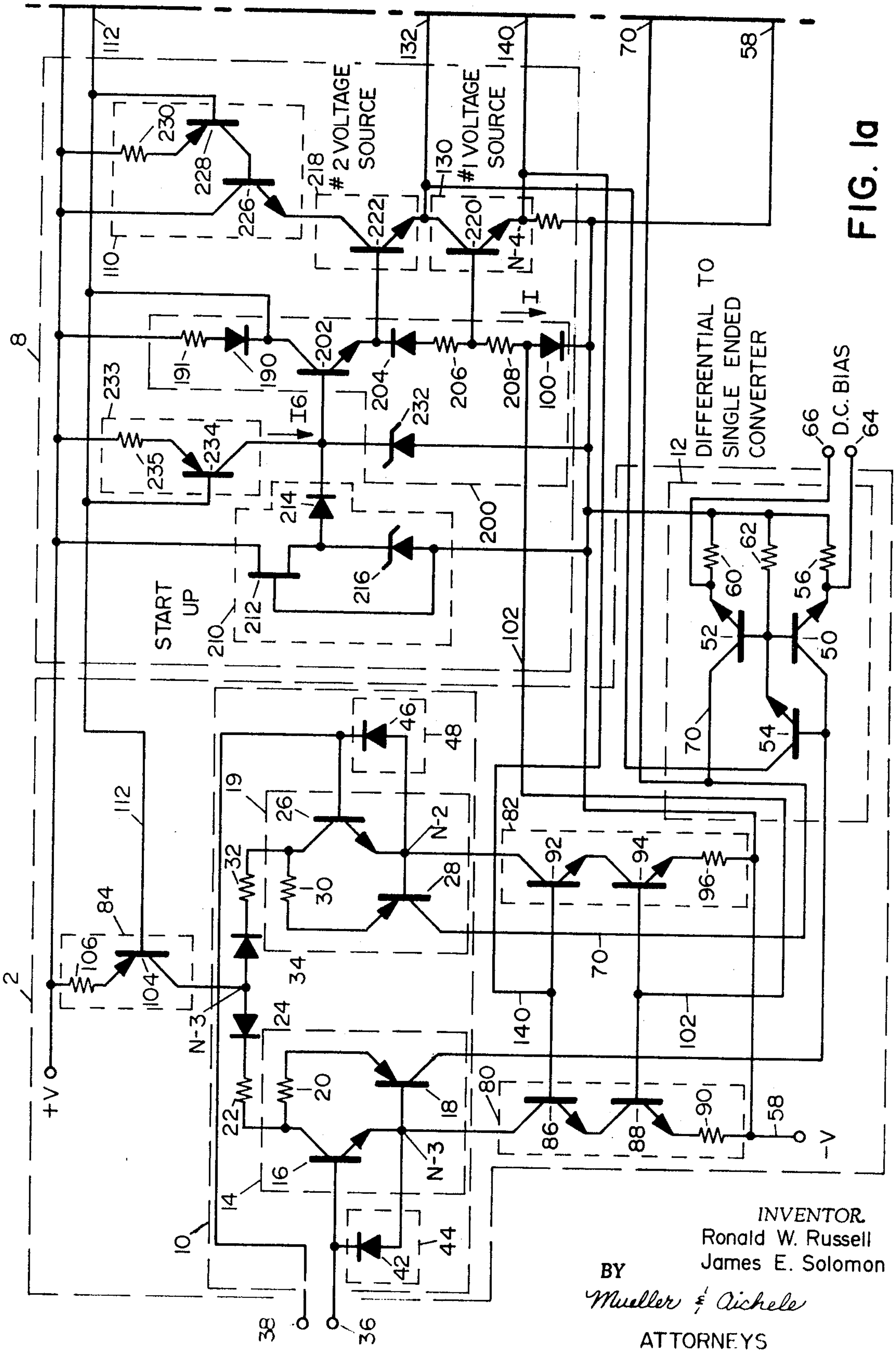

INVENTOR.
Ronald W. Russell
James E. Solomon

BY *Mueller & Aichele*

ATTORNEYS

INVENTOR.
Ronald W. Russell
James E. Solomon
BY
Mueller & Aichele
ATTORNEYS

HIGH VOLTAGE OPERATIONAL AMPLIFIER

BACKGROUND

This invention relates to monolithic operational amplifiers, and more particularly, it relates to a monolithic operational amplifier suitable for operation with higher level power supplies then presently available. The upper limit supply-voltage limitation characteristic of monolithic operational amplifiers arises primarily from the low breakdown voltage of monolithic NPN transistors. This results from present difficulties in fabricating epitaxial collector material with resistivites greater than 3 to 5 ohm-cm. The detailed breakdown mechanism is not completely understood, but it is usually explained in terms of avalanche multiplication of leakage current in the collector-base junctions.

Accordingly, it is an object of the invention to provide a novel monolithic operational amplifier suitable for high supply voltage operation.

It is a further object of the invention to provide a novel monolithic operational amplifier capable of handling large differential input voltages.

Another object of the invention is to provide a novel monolithic operational amplifier having a constant reference current for maintaining bias currents at a uniform level.

A still further object of the invention is to provide a novel monolithic operational amplifier having a biasing network which is protected during destructive transient conditions experienced during circuit turn on.

Another object of the invention is to provide a novel monolithic operational amplifier having a current limiter in the output stage to protect against a negative short circuit condition.

A still further object of the invention is to provide a monolithic operational amplifier having a large signal input protection,

SUMMARY

The total supply voltage limitation on previous monolithic operational amplifiers is limited to the collector emitter breakdown voltage with the base open ($BV_{CEO}$) of the monolithic NPN transistors used in the design of the operational amplifier. Such is the case because both the collector-emitter breakdown voltage with the base open ($BV_{CEO}$) of monolithic PNP transistors and the collector-base breakdown voltage with the emitter open ($BV_{CBO}$) of monolithic NPN transistors is much higher. The monolithic operational amplifier herein disclosed overcomes the lower $BV_{CEO}$ and the breakdown voltage of the device is now limited to the higher levels of $BV_{CEO}$ of monolithic PNP transistors and the $BV_{CBO}$ of monolithic NPN transistors. This voltage limiting factor is overcome by the invention of the present operational amplifier adding a resistor in the emitter lead of the transistors in the differential amplifier, thus increasing the ratio of the impedance between the impedance in the emitter lead and the impedance in the base lead.

The internal bias current is held constant to prevent any heat dissipation problem. An independent start circuit is provided for the internal bias current regulator for overcoming the electrical inertial of this circuit.

An additional transistor is provided in the biasing circuit for use during the turn-on period of the circuit. In this manner the initial high voltage experienced at the time of turn-on is shared by a plurality of transistors. After the destructive transient voltage swings have diminished the aforesaid transistor is electrically eliminated.

Negative short circuit current limit protection is achieved by a separate current path under short circuit conditions. The critical output transistors are prone to burn out if unprotected and thus have a limited amount of drive current applied thereto.

Separate diodes are placed across the emitter base electrodes of the input stages of the monolithic operational amplifier for large signal input protection. These diodes prevent an excessive slew rate at the emitter of the input transistors.

DESCRIPTION

Referring to FIG. 1*a*, the operational amplifier of the instant invention comprises an input stage 2, a second gain stage 4, a class AB output stage 6 and a bias network 8. The input stage 2 is further subdivided into functional units and comprises a differential amplifier 10 and a single ended converter 12. The differential amplifier 10 comprises a first composite transistor stage 14 having a first transistor 16 of a first conductivity type and a second transistor 18 of a second conductivity type and a second composite transistor stage 19..

In combination, the transistors 16 and 18 act as a PNP transistor which has a very low input current because of the high gain of the transistor 16. The emitter degeneration circuit of the stage 14 comprises a series connection of the emitter lead of the transistor 18, a first resistor 20, a second resistor 22 and a diode 24 wherein its cathode electrode of the diode 24 is connected to the resistor 22.

As is well known, diodes are conventionally fabricated in integrated circuits from a transistor of either conductivity type which has its base and collector terminals shorted together for one terminal of the diode with the emitter of the transistor being the other remaining terminal of the diode. The sense of the diode is determined by the conductivity type of the transistor used to fabricate the diode This sense is shown in the Figure. The collector electrode of the transistor 16 is connected to the junction of the resistors 20 and 22. The emitter electrode of the transistor 16 is connected to the base electrode of the transistor 18.

The second composite transistor stage 19 comprises a first transistor 26 of a first conductivity type and a second transistor 28 of a second conductivity type. In combination, the transistor 26 and 28 act as a PNP transistor which has a very low input current because of the high gain of the transistor 26. The emitter degeneration circuit of the stage 19 comprises a series connection of the emitter of the transistor 28, a first resistor 30, a second resistor 32 and a diode 34, wherein its cathode electrode is connected to the resistor 32. The collector electrode of the transistor 26 is connected to the junction of the resistors 30 and 32.

The differential input signal is applied to the differential amplifier 10 from a differential signal source 35 by a pair of input terminals 36 and 38 for application to the base electrodes of the transistors 16 and 26. A diode 42 connected across the base and emitter electrodes of the transistor 16 forms a voltage protection circuit 44 for the transistor 16. A diode 46 connected across the base and emitter electrodes of the transistor 26 forms a voltage protection circuit 48 for the transistor 26.

The differential to single ended converter 12 comprises a plurality of transistors 50, 52 and 54, a resistor 56 connected between the emitter lead of the transistor 50 and a negative terminal of a voltage source such as a battery 58, a resistor 60 connected between the emitter lead of the transistor 52 and the negative voltage source 58, and a resistor 62 connected between the junction formed by the connection of the base leads of the transistors 50 and 52 with the emitter lead of the transistor 54 and the negative voltage source 58. The junction of the resistor 56 and the emitter lead of the transistor 50 is made accessible to a source of DC potential by a line 64. The junction of the resistor 60 and the emitter lead of the transistor 52 is made accessible to a source of DC potential by a line 66. These lins are made available so the DC bias potential is connectable into the circuit 12.

The differential to single ended converter circuit 12 takes the differential signal which is at the collector of the transistors 18 and 28 and converts this signal to a single ended signal for application to the second stage 4 over a line 70 connected to the collector of the transistor 52. As is known, the current in the collector of the transistor 18 modulates the voltage at the base of the transistor 52 causing the current flowing in the emitter collector circuit of transistor 52 to change in an opposite manner to the current in the collector circuit of transistor 18. The signal at the collector of the transistor 52 is therefore double in magnitude over that applied by the collector ofthe transistor 28.

A plurality of current sources 80, 82 and 84 are provided specifically in the input stage 2.

The voltages at the nodes N1 and N2 can be different in magnitude in the operation of the amplifier. The bias currents required at these nodes must be provided by separate current sources 80 and 82. A third bias current 84 is required at node N3. The first such current source comprises a first transistor 86 connected in a cascode connection with a second transistor 88 and a resistor 90. The other end of the resistor 90 is connected to the negative terminal of the voltage source 58. The second current source 82 comprises a first transistor 92 connected in cascode relationship with a second transistor 94 and a resistor 96 having its other end connected to the negative terminal of the voltage source 58. The transistors 86 and 92 of thefirst current source 80 and the second current source 82 respectively have their base leads connected to the voltage source 130 which provides base current for the transistors 86 and 92.

Node number 1 (N1) is formed by the junction of the following terminals: the collector of the transistor 86, the base of the transistor 18, the emitter of the transistor 16 and the anode of the diode 42. Node number 2 (N2) is formed by the junction of the following terminals: the collector of the transistor 92, the base of the transistor 28, the emitter of the transistor 26 and the anode of the diode 46.

The current developed in a diode 100 which forms a part of the bias network 8 furnishes the bias current to the bases of the transistors 88 and 94 by a line 102. The operation of diode 100 is fully described hereinafter, but it should be sufficient at this time to indicate that the current sources 80 and 82 respond to the current I generated by the diode 100 and available at 25 in FIG. 1a.

The transistors 86 and 92 are connected in a common base configuration. The common base cascode of the transistor 86, in the current source 80 and the common base cascode of the transistor 92 in the current source 82 allow the input voltage to be at a relatively high level with respect to the minus voltage supply of the amplifier 12.

In operation, the impedance seen at the base electrodes of transistors 86 and 92 is very low while the impedance in the emitter is that of a current source. Therefore, the breakdown voltage, collector to base of the transistors 86 and 92 is $BV_{CBO}$ of the transistor which is higher by almost a factor of two than the breakdown voltage $BV_{CEO}$ of the transistor.

A third current source 84 for the amplifier 10 comprises a transistor 104 and a resistor 106 connected between the emitter of the transistor 104 and a positive voltage source which could be the positive terminal of the voltage source 58.

The collector of the transistor 104 is connected to node number 3 (N3) which additionally includes the junction of the anodes of the diodes 24 and 34. The base lead of the transistor 104 is connected to the voltage source 200 by a line 112. The voltage developed over the resistor 191 and diode 190 is used as a reference voltage $V_2$ for the base of 104 as well as other bases connected thereto. The current furnished by this current source 84 is divided between the two stages 14 and 19 of the differential amplifier 10 and is switched between the two halves according to the input differential signal to the amplifier.

Figure 1B:
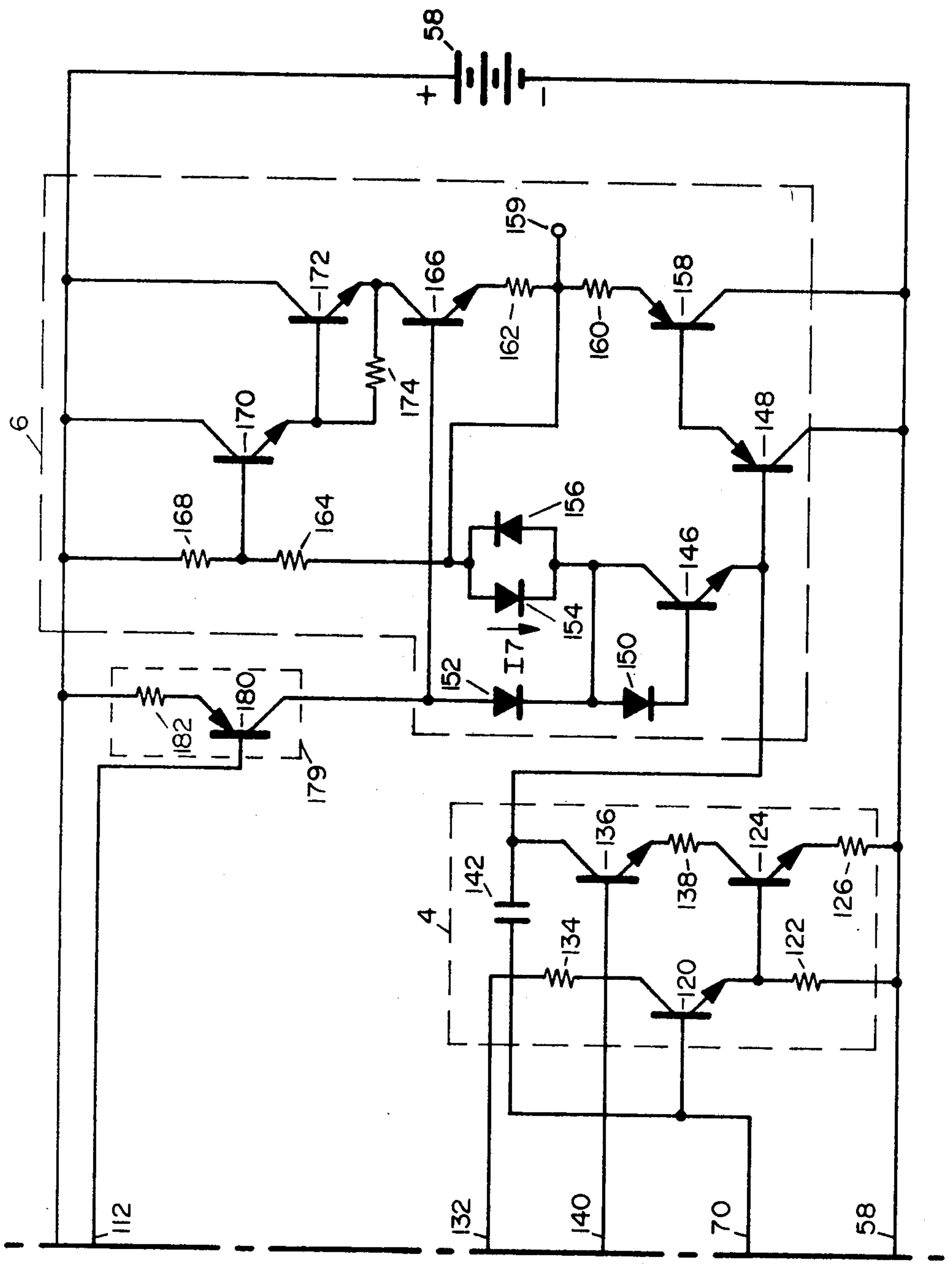

Referring to FIG. 1*b*, the second stage 4 of the operational amplifier comprises a transistor 120 connected as an emitter follower and having a resistor 122 connected between the emitter lead of the transistor 120 and the negative terminal of the source 58. The junction of the emitter of the transistor 120 and the resistor 122 is connected to the base of a second transistor 124. The emitter lead of the transistor 124 is connected to the negative terminal of the voltage source 58 by a resistor 126. The collector of the transistor 120 is connected to a first voltage source 130, located in the bias network 8 by a line 132 and a resistor 134. The collector of the transistor 124 is connected to the emitter of a transistor 136 by a resistor 138. The base of the transistor 136 is connected to another terminal of the first voltage source 130 by a line 140. A capacitor 142 is connected between the base lead of the transistor 120 and the collector lead of the transistor 136 and this last mentioned junction forms the output of the second stage 4 for application to the class AB output stage 6 over a line applied to the junction of the emitter lead of a transistor 146 and the base lead of a transistor 148.

Referring briefly back to the operation of the second stage 4, such stage provides additional gain for the operational amplifier while also providing frequency compensation to the amplifier through the use of the pole splitting capacitor 142.

The transistor 146 is connected in Darlington fashion with a diode 150. The cathode of the diode 150 is connected to the base lead of the transistor 146 and the anode of the diode 150 is connected to the junction formed by the cathode of a diode 152, the cathode of a second diode 154, the collector lead of the transistor 146, and the anode of a diode 156. The collector lead of the transistor 148 is connected to the negative source 58 and the emitter of the transistor 148 is connected to the base of a transistor 158. The transistor 158 has its collector lead connected to the source of negative potential 58 and the emitter lead of the transistor 158 is connected to an output voltage terminal 159 by a resistor 160, which output terminal is connected to a junction of the cathode of the diode 156, the anode of the diode 154, one end of a resistor 162, and one end of a resistor 164. The other end of the resistor 162 is connected to the emitter lead of a transistor 166. Theother end of the resistor 164 is connected to the junction of one end of a resistor 168 and the base lead of a transistor 170. The emitter lead of the transistor 170 is connected to the junction of the base lead of a transistor 172 and a resistor 174. The other end of the resistor 174 is connected to the junction of the collector of the transistor 166 and the emitter of the transistor 172. The other end of the resistor 168 and the collector leads of the transistors 170 and 172 are connected to the positive side of the voltage source 58.

A transistor 180 has its emitter lead connected to the positive side of the voltage source 58 by a resistor 182, its collector to the junction of the base electrode of the transistor 166 and the cathode of the diode 152. The base lead of the transistor 180 is connected to the first reference source 110 located in the bias network 8 by a line 184.

In review the class AB output stage 6 of the instant invention provides an emitter follower transistor 166 which provides current drive for the positive excursions of the output Generally, the transistor 180 with its emitter resistor 182 is the current source for the stage 6, and more specifically provides the current source for the base of the emitter follower 166. The reference voltage V2 for the base of the transistor 180 originates at the cathode electrode of a diode 190 in the bias network 8. A resistor 191 is connected between the anode electrode of the diode 190 and the positive side of the source 58.

The .transistors 170 and 172, the resistors 164 and 168 and the resistor 174 form a cascode connection with the transistor 166 and thereby share the voltage between the output and the positive supply with the transistor 166. For large negative swings of the amplifier, the voltage across the collector to emitter junction of the transistor 166 is very nearly half of the total voltage from the positive supply to the output. The remaining half being absorbed by the transistor 170 and 172.

The short circuit protection is provided for two kinds of short circuits, one in which the amplifier is driving current into a load and the other in which current is being pulled from the load into the amplifier. In the first case, the diode 156 and the diode 152, transistor 166 and the resistor 162 connected to the output are concerned. The increasing voltage across the resistor 162 causes the diode 156 to become forward biased and causes the drive current applied to the base of transistor 166 to be diverted through the diode 156. This limits the output short circuit current going into a load.

The negative short circuit protection circuit is comprised of the diode 154 and the diode 150, the transistor 146, the transistors 136 and 124 of the second stage, the resistor 138 in the emitter of transistor 136 and the resistor 126. Generally, under thhe negative short circuit condition, current is being drawn into the amplifier output from the load. More specifically, current is being drawn into the emitter lead of the transistor 158 through the reistor 160. A current limit must be made on the current in the emitter of the transistor 158 to prevent the amplifier from burning out during the short circuit. This is accomplished by the presence of the resistor 160 and the diode 154. When the voltage across the resistor 160 increases to the forward bias voltage required on the diode 154, current flows through the path comprising the diode 154, through the Darlington connection of diode 150 and the transistor 146, and into the collector of the transistor 136 thereby depriving the Darlington connection of transistors 148 and 158 of additional base current and limiting its emitter current to the value which turns on the diode 154. However, current now is increasing in the collector lead of the transistor 136 and the common emitter transistor 124. In the prior art, the current is normally limited by depriving the base of the emitter follower transistor 120 of additional base drive when the voltage across resistor 126 reaches the $V_{BE}$ of the NPN transistor connected to provide that function by being connected with its base at the emitter of transistor 124, its emitter at the negative voltage source 58 and its collector at the base of transistor 120. In the present invention, the common base cascode is exploited by adding the emitter resistor 138. When the current then increases in the transistor 136, the emitter voltage of 136 increases, the base voltage of 136 remains fixed. This tends to shut the transistor 136 off or in effect operates as a negative feedback. This limits the current in the transistor 136 under negative short circuit conditions to approximately 2 milliamps. The prior art circuits have only been able to limit the current flowing in this stage to approximately 14 milliamps and stay within other constraints on the amplifier.

Reviewing the circuits made available for providing negative short circuit current limit protection, there is more than one path that the current can take from the output into the circuit. The primary path is through the emitter electrode of the transistor 158 to the negative voltage supply 58 by the collector lead of the transistor 158. This current is limited by the addition of the resistor 160. When the voltage across the resistor 160 increases to the forward diode voltage of the diode 154, current increases in the diode 154 through the Darlington connection of the diode 150 and the transistor 146 and into the collector lead of the transistor 136 and subsequently through the resistor 138, the transistor 124 and the resistor 126 to the negative terminal of the voltage supply 58. This current now is depriving the Darlington connected transistors 148 and 158 of additional base current, thereby limiting the emitter current of these transistors 148 and 158. The current in the diode 154, which eventually flows through the transistor 136, however, must be limited to some safe value. In prior amplifiers, this has been accomplished by the addition of a small emitter resistor in the common emitter second stage transistor and using the base emitter of an NPN transistor to sense a large current in the small resistor and depriving the follower of additional current. However, in the present invention, the resistor 138 and the resistor 134 are added. As the current in the transistor 136 increases, due to the increased current flowing in the diode 154 caused by its being forward biased, the emitter voltage of the transistor 136 rises because of thevoltage drop across resistor 138. This increase in voltage tends to back bias the base emitter junction of the transistor 136 which has a fixed voltage at its base and therefore limits the emitter current of the transistor to aproximately 2 milliamps. The transistor 124 is also protected because under these conditions it is in saturation. The saturation current is limited by the addition of the resistor 134. As the current increases in the transistor 120 and flows into the base of the transistor 124 which is already in saturation, the transistor 120 is now brought into saturation and the drive current from the first stage is the only additional current whichthen which then in the base circuit. This drive current is limited to approximately 70 microamps.

The bias network of the present invention has as an integral part thereof a current regulator 200 comprising a plurality of devices connected between the positive and negative sides of the voltage source 58. The anode of the diode 190, of the first such device, is connected to the positive terminal of the voltage source 58 through a resistor 191 and its cathode is connected to the collector lead of a transistor 202. The emitter terminal of the transistor 200 is series connected with a first diode 204, a first resistor 206, a second resistor 208, and the diode 100 connected so as current flows from the diode 190 through the series connection of devices set out above and into the negative terminal of the voltage source 58. This diode, transistor resistor string provides a bias current I and a plurality of reference voltages $V_2$ through $V_5$.

The current regulator 200 is equipped with a start circuit 210 comprising a FET transistor 212 having its source electrode connected to the positive terminal of the voltage source 58, its drain electrode connected to the junction of the cathode of a diode 214 and the plate electrode of a zener diode 216. The other electrode of the diode 214 is connected to the base electrode of the transistor 202.

The remaining portion of the bias network comprises the first voltage source 130, as previously recited, and an additional voltage source 218. The first voltage source 130 comprises a transistor 220 having its collector connected to the emitter electrode of a transistor 222 which comprises the second voltage source 218. The emitter of the transistor 220 is connected to the negative terminal of the source 58 by a resistor 224 and to the base electrode of the transistor 92, as previously mentioned, to provide the base current for the current sources 80 and 82 by voltage levels $V_6$ and $V_7$.

The second voltage source has the base lead of the transistor 222 connected to the junction formed by the connection of the anode electrode of the diode 204 and the emitter electrode of the transistor 202, and the collector electrode of the transistor 222 connected to the emitter electrode of a first transistor 226 in the turn-on circuit 110. The collector electrode of the transistor 226 is connected to the positive side of the voltage source 58 and the base electrode of the transistor 226 is connected to the collector electrode of a second transistor 228 in the protection circuit 110. The emitter electrode of the transistor 228 is connected to the positive side of the voltage source 58 by a resistor 230, and the base is connected to the cathode of the diode 190 and the collector electrode of the transistor 202.

The base electrode of the transistor 202 is also connected to the plate electrode of a second zener diode 232 and the anode electrode of the zener diode 232 is connected to the negative terminal of the voltage source 58. The base electrode of the transistor 202 is also connected to the collector electrode of a transistor 234, which transistor has its base lead connected to the cathode of the diode 190 which provides a reference voltage because of the reference current flowing in it. This reference voltage is also applied to the base of an electrode of the transistor 104 by a line 112. The emitter lead of the transistor 234 is connected to the positive voltage source 58 by a resistor 235.

In reviewing the operation of the bias network of the amplifier, the current regulator 200 provides reference currents I and $I_6$ and voltages ($V_1 - V_7$) throughout the amplifier. This current regulator 200 has a start circuit 210 which comprises the transistor 212, the zener diode 216 and the diode 214. The start circuit responds to a small amount of current coming from the positive supply and flowing through the transistor 212 and the diode 214 into the base of the transistor 202. This current flowing into the base of the transistor 202 causes an increase in current flow in the collector of the transistor 202, which in effect draws additional current through the diode 190. Since the voltage at the cathode of the diode 190 is applied to the base electrode of the transistor 234, additional current flows in the collector circuit of the last mentioned transistor which turns on the zener 232. The magnitude of the reference current of the amplifier is the zener voltage of the zener diode 232 minus the base emitter voltage of the transistor 202, and the voltage drop occurring over the diodes 100 and 204 divided by the resistors 206 and 208. The transistor 220 provides the voltage needed at the base of the transistor 136 of thesecond stage 4 and also the voltage needed at the base of the transistors 86 and 92 of the current sources 80 and 82 in the input stage 2 of the amplifier. the transistor 222 provides the voltage needed for the collector electrode of transistors 54 and 120 and also the collector electrode of the transistor 220. The transistors 226 and 228, and the resistor 230 are a turn-on protection circuit for the transistor 222 and the transistor 120 in the second stage 4 and the transistor 124. This phase of the turn-on protection operates in the following manner. During turn-on, the reference current I, which normally flows in the direction through the regulator 200 as shown, has not yet been established, and the base electrode of the transistor 228 has no source for an input current and therefore a $BV_{CEO}$ breakdown condition must be avoided. Each transistor has a $BV_{CEO}$ voltage. When two transistors are connected in series the breakdown voltage of the series connected transistors is the sum of each transistor's $BV_{CEO}$. When the applied voltage exceeds the breakdown voltage of any transistor or group of transistors, the transistors will be destroyed by excessive current flow. If the turn on protect circuit 110 is not used, the series connected emitter followers 220 and 222 are faced with a $BV_{CEO}$ condition during the turn on time when no signal is available fromthe regulator for application to their base leads. During turn on, the applied voltage for a high voltage amplifier can exceed the sum of the $BV_{CEO}$ voltage for the transistor 222. The turn on protect circuit 110 is placed in series with the transistor 222 across the supply voltage 58. The turn on protect circuit adds an additional $BV_{CEO}$ to that $BV_{CEO}$ of the transistor 222. To prevent any such breakdown during turn on condition. Once the reference current I has been established in amplifier, the turn on protect circuit should automatically remove itself from the series connection and this is accomplished by having the transistor 228 provide more than the amount of base current needed for the transistor 226. Transistor 228 goes into saturation and the voltage at the base of the transistor 226 is that of the voltage drop across the resistor 230 plus the saturation voltage of the transistor 228.

The reference current I through the diode 100 provides the reference voltage at the anode of the diode 100 which is used in conjunction with transistors 88 and 94 and the resistors 90 and 96 to obtain the current for the sources 80 and 82. Additionally, this reference current I flowing in the diode 190 and the resistor 191 also provides the reference voltage for the current source 84, the current source 233, which provides for the current to the zener 232 under normal operation, the current source 110, and finally the output current source 179. The transistor 234 and its emitter resistor 235 supplies the current needed to bias the zener diode 232. The high voltage capacity of the reference current source occurs because of the low impedance in the base lead transistor 202 as compared to the impedance in the emitter of the transistor 202. Therefore, this transistor is in very nearly a common base mode with a breakdown voltage of $BV_{CEO}$. Also, the transistor 222 has a very low base impedance in a normal mode of operation while the impedance in its emitter is that of a collector. This places the transistor 222 in a common base mode with the attending breakdown voltage of $BV_{CBO}$.

Referring again to the novel feature of the instant invention, and more specifically to the voltage protection circuits 4 and 48, one of the objectives of the instant invention is to maintain the operating characteristics of the differential amplifier 10 in a known balance. Hence, it was found that the addition of the diodes 42 and 46 prevented the transistors 16 and 26 from zenering. This condition of zenering should be avoided because once a transistor has zenered, its operating characteristics are no longer dependable. Zenering occurs when the electrical field across a junction exceeds a certain prescribed differential and the transistor breaks down by avalanche current conduction. This breakdown voltage is controlled by manufacturing techniques including the doping concentration used during manufacture.

The high voltage operation of the operational amplifier is reflected in several element additions to the circuit shown and disclosed. The input circuits are adapted by adding the transistors 86 and 92, the output circuit is prepared to handle large positive output voltages by the addition of the transistor 136, the output circuit is prepared to handle large negative output voltages as more specifically described with reference to the cascode of the Darlington of transistors 170 and 172 with transistor 166.

Due to the normal heat dissipation problem experienced in operational amplifiers, it is desirable to prevent the biasing currents from increasing with increasing supply voltages, For keeping the bias currents at a constant value, independent of supply voltage and temperature, an internal current regulator is provided which supplies a constant reference current I, which establishes all the remaining bias currents and voltages in the circuit. This current I is equal to the zener diode voltage of diode 232 less the base-emitter drop of the transistor 202 and the diode drop of the diodes 204 and 100 divided by the resistance of the resistors 206 and 208 and is therefore essentially independent of supply voltage. Temperature independence is achieved by balancing the effects of the positive temperature coefficients of the diode 232 and the base diffused resistors 206 and 208 against the negative temperature coefficients of the base-emitter voltage of the transistor 202 and the diode drops of the diodes 100 and 204.

The field effect transistor 212, the zener diode 216, and the second diode 214 comprise a start circuit for the regulator 200. The transistor 212 initially furnishes a small amount of current to the base of the transistor 202, operatively connected in parallel therewith, and then a positive feedback loop takes over as increases in I cause increases in 16 and as 16 increases, I increases still further. The directions of I and 16 are shown in the figure. This increase in current continues until diode 232 conducts. The diode 214 then becomes reversed biased, decoupling any changes in the current of the transistor from the reference current I, as the diode 216 now absorbs the start current.

If the collector of the biasing transistor 222 in the voltage source 218, were directly connected to a positive supply line, omitting the turn-on protection circuit 210 from the circuit, then a destructive mode would occur. This is a result of the low breakdown voltage of the transistor 222 during the start up sequence as described above. The impedance seen by the base of the transistor 222, before the current I is established, is high and therefore the transistor 222 is in a $BV_{CEO}$ mode. Application of a large supply voltage therefore causes the destructive breakdown of the transistor 222 and then those additional transistors 120 and 124 in the current path. The transistor 228 prevents the destructive mode by sharing the high voltage until the bias current I is established.

The negative short circuit current limit occurs when the voltage drop across the resistor 160 turns on the diode 154 and a current, $I_7$, flows from the output through the diode 154, the Darlington connection of the diode 150, and the transistor 146, the transistor 136, the resistor 138, the transistor 124 and the resistor 126. The circuit is designed to deprive the transistor 148 of additional drive current during this current limit mode. In this circuit, the transistor 124 saturates when increased current flows in the resistor 138 and then the transistor 146 becomes a constant current source which accepts only approximately 2mA. Under negative output swing conditions, the transistor 120 can also center saturation and it is therefore protected from drawing excessive current by the resistor 134.

There is a possibility of large voltage changes occurring rapidly at the inputs to an op amp. The slew rate limitation at the emitters of the input transistors can cause these devices to experience an emitter-base breakdown when a rapidly changing input signal is applied. An NPN transistor subjected to emitter-base breakdown can suffer an unpredictable change in the transistor characteristics. This is avoided by the addition of diodes 42 and 46.

The following circuit element values have been used in the preferred embodiment.

R20 = 1,500 ohms
R22 = 500 ohms
R30 = 1,500 ohms
R32 = 500 ohms
R54 = 1,000 ohms
R60 = 1,000 ohms
R62 = 39,000 ohms
R90 = 7,700 ohms R96 = 7,700 ohms
R106 = 5,000 ohms
R122 = 39,000 ohms
R126 = 50 ohms
R134 = 5,000 ohms
R138 = 500 ohms
R160 = 12 ohms
R162 = 26 ohms
R164 = 28,000 ohms
R168 = 28,000 ohms
R174 = 15,000 ohms
R182 = 12,000 ohms
R191 = 1,000 ohms
R206 = 4,700 ohms
R208 = 3,500 ohms
R230 = 12,000 ohms
R235 = 1,500 light ohms While the invention has been particularly shown and described with reference to preferred embodiments thereof, it will be understood by those skilled in the art that the foregoing and other changes in form and details may be made therein without departing from the spirit and scope of the invention.

What I claim is:

1. A monolithically fabricated amplifier circuit for use in combination with a differential signal source generating differential input signals, and a load serving as a source for currents and a sink for currents, and a potential source having a first potential level and a second potential level more positive than said first potential level, said amplifier comprising:

input terminal means connectable to the differential signal source for receiving the differential input signals;

output terminal means connectable to a load;

potential source terminal means connectable to the potential source for receiving the first potential level and the second potential level which is more positive than said first potential level;

a bias network connected between said first potential level and said second potential level for generating a plurality of bias currents and reference voltages, and further including, start up means connected to said first potential level and to said second potential for providing an initial source of current to said bias means for activating said bias means, a plurality of emitter followers having base, collector and emitter electrodes, and respective base electrodes responsive to certain of said reference voltages for generating an equal plurality of additional reference voltages at respective emitter electrodes, and said emitter of one emitter follower being connected to the collector of another emitter follower, and means for connecting said emitter of said second emitter follower to said first potential level for limiting the current flowing in said first and second emitter followers during quiesecent condition, and turn on protect means connected between said collector of said first emitter follower and said second potential level for limiting said current flow through said first emitter follower during the build up of said bias currents through said bias means; a differential amplifier having:

a first stage connected input terminal said inputterminal means and responsive to one of said differential input signals, and said first stage further including, a first transistor having collector, baseand emitter electrodes, and forming at least a base-collector junction and a base-emitter junction,and said emitter electrode having a stray capacitance-value, and said base electrode beingresponsive to one of said differential inputsignals, a first independent input bias terminal connected to said emitter of said first transistor, means responsive to said bias network for establishing a constant current flow from said first bias terminal.

a first current output means for rendering available the output signal from said first stage, and a first input diode connected across said emitter-base junction of said first transistor for providing a current path for discharging said stray capacitance into said signal source, a second stage connected to said input terminal means and responsive to another of said differential input signals, and said second stage further including, a second transistor having collector, base and emitter electrodes, and forming at least a base-collector junction and a base-emitter junction, and said emitter electrode having a stray capacitance value, and said base electrode being responsive to one of said differential input signals;

a second independent input bias terminal connected to said emitter of said second transistor, means responsive to said bias network for establishing a constant current flow from said second bias terminal, a second current output means for rendering available the output signal from said second stage, and a second input diode connected across said emitter-base junction of said second transistor for providing a current path for discharging said stray capacitance into said signal source, a common input bias means responsive to said bias network for supplying a constant current to said first stage and said second stage; means responsive to said bias network and further responsive to said first current output means and to said second current output means for converting said output signals from each stage of said differential amplifier to a single ended output signal; and output circuit means responsiveto said converting means for providing drive current to said output circuit means and said output circuit means including:

A cascode connected amplifier stage having a first transistor and a second transistor and having at least one resistor connected in the current path between one of the voltage supply levels and the output terminal, and connected intermediate the emitter of the first transistor and the collector of the second transistor, said first transistor being responsive in part to one of said reference voltages and to said second transistor, and said second transistor responsive to the single ended output signal from the converting means;

an output emitter follower stage connected intermediate said collector of said first transistor and said output terminal including a resistor in the emitter lead of the emitter follower;

a passive current path connected in parallel with said output emitter follower stage for limiting current in said output emitter follower stage whereby, the emitter resistor in combination with the passive current path limits the current flowing in the emitter follower stage and the resistor connected between the first and second transistors in the cascode amplifier in combination with said reference voltage (V7) limits the current in the passive current path.

2. An electronic circuit for use with a potential source having a first potential level and a second potential level more positive than said first potential level, said circuit comprising:

a bias network connected between said first potential level and said second potential level for generating a plurality of bias currents and reference voltages and further including, at least one emitter follower having base, collector and emitter electrodes, and said base electrodes being responsive to one of said reference voltages for generating an additional reference voltage at said emitter electrode, and a resistor for connecting said emitter of said emitter follower to said first potential level for limiting the current flowing in said emitter follower during quiescent condition, and turn on protect means connected between said collector of said emitter follower and said second potential level for preventing the $BV_{CEO}$ of said emitter follower from being exceeded by the voltage source and for limiting said current flow through said first emitter follower during the build up of said bias currents through said bias means and said turn on protect means including, a first transistor (226) including base, emitter and collector electrodes and having its emitter connected to said collector lead of said emitter follower and its collector lead connected to said second potential level, a resistor connected at one end to said second potential level, a second transistor including base, emitter and collector electrodes and having its collector connected to said base of said second transistor and its emitter connected to the other end of said resistor, and biasing means connected to said base of said second transistor for forward biasing said second transistor as said impedance seen by said base of said first transistor reduces and causes current fixed by said resistor to flow into said base of said second transistor and causing said second transistor to activate said first transistor, whereby, during the activity of the circuit when no bias currents are flowing in the bias means, the $BV_{CEO}$ of the turn on protect means adds to the $BV_{CEO}$ of the emitter follows for increasing the voltage that can be applied across the emitter follow and after the bias currents have been established, the turn on protect circuit operates as a voltage source for said emitter follows without adversely affecting the lower limit of operation of the circuit.

* * * * *